United States Patent
Rushford et al.

(10) Patent No.: US 6,740,194 B2
(45) Date of Patent: May 25, 2004

(54) APPARATUS FOR ETCHING OR DEPOSITING A DESIRED PROFILE ONTO A SURFACE

(75) Inventors: Michael C. Rushford, Livermore, CA (US); Jerald A. Britten, Oakley, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 10/350,709

(22) Filed: Jan. 24, 2003

(65) Prior Publication Data

US 2003/0141275 A1 Jul. 31, 2003

Related U.S. Application Data

(62) Division of application No. 09/687,775, filed on Oct. 13, 2000, now Pat. No. 6,555,017.

(51) Int. Cl.[7] .................................................. B08B 3/10
(52) U.S. Cl. ..................................... 156/345.15; 134/30
(58) Field of Search ....................... 156/345.11, 345.15; 134/30, 25.4, 141; 216/84

(56) References Cited

U.S. PATENT DOCUMENTS

| 5,660,642 A | * | 8/1997 | Britten | ........................ 134/30 |
| 5,882,433 A | * | 3/1999 | Ueno | ........................... 134/31 |
| 6,257,255 B1 | * | 7/2001 | Oshinowo | .................... 134/141 |
| 6,555,017 B1 | * | 4/2003 | Rushford et al. | ............. 216/84 |
| 2001/0045223 A1 | * | 11/2001 | Cho et al. | .................. 134/25.4 |
| 2002/0074023 A1 | * | 6/2002 | Fishkin et al. | ................ 134/30 |

* cited by examiner

Primary Examiner—Gregory Mills
Assistant Examiner—Sylvia MacArthur
(74) Attorney, Agent, or Firm—Michael C. Staggs; L. E. Carnahan; Alan H. Thompson

(57) ABSTRACT

An apparatus and method for modifying the surface of an object by contacting said surface with a liquid processing solution using the liquid applicator geometry and Marangoni effect (surface tension gradient-driven flow) to define and confine the dimensions of the wetted zone on said object surface. In particular, the method and apparatus involve contouring or figuring the surface of an object using an etchant solution as the wetting fluid and using real-time metrology (e.g. interferometry) to control the placement and dwell time of this wetted zone locally on the surface of said object, thereby removing material from the surface of the object in a controlled manner. One demonstrated manifestation is in the deterministic optical figuring of thin glasses by wet chemical etching using a buffered hydrofluoric acid solution and Marangoni effect.

20 Claims, 5 Drawing Sheets

APPARATUS FOR ETCHING OR DEPOSITING A DESIRED PROFILE ONTO A SURFACE

RELATED APPLICATION

This application is a division of U.S. application Ser. No. 09/687,775, filed Oct. 13, 2000 now U.S. Pat. No. 6,555,017, entitled "Surface Contouring By Controlled Application Of Processing Fluid Using Marangoni Effect."

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates to modifying the surface of an object by contacting said surface with a liquid processing solution using the liquid applicator geometry and the Marangoni effect (surface tension gradients) to define and confine the dimensions of the wetted zone on said object surface. In particular, the invention relates to contouring or figuring the surface of an object using an etchant solution as the wetting fluid and using real-time metrology (e.g. interferometry) to control the placement and dwell time of this wetted zone locally on the surface of said object, thereby removing material from the surface of the object in a controlled manner. One demonstrated manifestation of this invention is in the deterministic optical figuring of thin glasses by wet chemical etching using a buffered hydrofluoric acid solution and the Marangoni effect.

2. Description of Related Art

Small-tool finishing or figuring of optical surfaces basically involves moving a small polishing tool in a controlled manner to shape the surface of an optic. It is a critical technology for producing optics for applications ranging from camera lenses for the consumer market, to large-aperture optics for inertial confinement fusion and space telescope systems. Examples of optics figured by these techniques include complex-figured aspheric lenses, continuous contour phase plates, Alvarez lenses, and optics requiring local figure correction after processing via traditional lap polishing. Small-tool finishing is simultaneously a mature technology and one undergoing continuous development driven by the high cost and reproducibility problems of processes when applied to ever-tightening figure tolerances.

Traditional techniques employ rotary polishing pads. Recent developments (e.g. U.S. Pat. No. 5,591,098 and references therein) utilize directed flow fields to impinge fine abrasive slurries onto the optical surface. Magnetorheological finishing (e.g. U.S. Pat. Nos. 5,499,313, 5,795,212, 5,839,944, 5,951,369) extend this concept by controlling the viscosity of specially formulated abrasive slurry by application of magnetic fields. Ion-beam milling techniques (e.g. U.S. Pat. Nos. 3,988,564, 5,969,368) are alternative, fundamentally different methods for high-accuracy optical figuring. All of the above-mentioned techniques suffer fundamental limitations. They rely on process knowledge of removal rates, and are therefore iterative processes: the workpiece must be dismounted from the machine and measured, reworked and remeasured, until specifications are met. Ion beam milling techniques require large, expensive vacuum processing chambers and are not applicable to all materials. Abrasive small-tool polishing techniques cannot be used to figure very thin optics since the local mechanical stresses involved cause workpiece deformations that impact removal control and can even cause breakage.

Material removal on optical surfaces can be accomplished by etching or dissolution methods (e.g. silicate glasses are soluble in hydrofluoric acid solutions), but until now, wet etching has not been employed to figure optics. The problem has been largely how to confine the wetted zone of etchant solution to a specific, stable geometry. A surface being etched is hydrophilic to the etching solution. If a bolus of etchant solution is moved along the surface of a workpiece, a thin liquid film will be left behind that will continue to etch the surface. Recently (U.S. Pat. No. 5,660,642), surface-tension gradient driven flow (the Marangoni effect) has been shown to be effective in causing this thin entrained film to flow off the surface of a workpiece back into the bulk liquid if said liquid is applied in the appropriate manner. The present invention utilizes the Marangoni effect to confine a wetted zone to a stable, defined geometry on the surface of a workpiece. The wetted zone remains of constant size and shape as it is moved around on the workpiece surface. This allows the fluid to act on the surface of the workpiece only in this wetted zone with no mechanical contact or induced mechanical stresses applied to the workpiece. This in turn allows for real-time local metrology of the processing, and allows for the processing of very thin 1 mm-thickness) plates that cannot be processed by other means.

SUMMARY OF THE INVENTION

It is an object of the present invention to provide a method and apparatus for modifying the surface of an object by contacting the surface of said object with a zone of liquid processing fluid such as an etching or deposition solution, and confining this zone by means of surface tension gradients (Marangoni effect). The size and shape of this wetted zone is defined by the mechanical design of the liquid applicator and the Marangoni effect. Additionally, this confined wetted zone can be, if desired, moved relative to the object surface in a controlled fashion so as to generate a pattern on the surface.

It is a further object of this invention to provide a method and apparatus for using real-time metrology and control algorithms to move this wetted zone in a deterministic fashion on the surface of the object for control of the figuring process.

It is a further object of this invention to produce large (>5 cm major axis) thin (<1 mm thickness) glass sheets figured flat to optical tolerances by use of the above methods and apparatus.

A key feature of this invention is the establishment of a meniscus of an aqueous processing liquid on the surface of the object to be processed, simultaneous with a means to establish a surface tension gradient in the meniscus region, such that the surface tension of said liquid is weakest where the liquid attaches to the solid. The means to achieve this has been reduced to practice by issuing the liquid upward and out of a vertical tube placed in proximity to a downward facing surface, such that a circular liquid wetted zone is established on said surface and the liquid flows down the outside surface of the tube. The liquid in the meniscus near its zone of attachment to the solid surface is relatively quiescent, while the liquid in the meniscus region where it transitions to the free surface falling film flow is continuously refreshed with liquid being pumped out of the supply orifice (tube). A surface tension gradient can be established in this meniscus by introducing a volatile organic compound (voc) into the vicinity of this meniscus, if such voc has the property that it is at least slightly water-soluble and produces a large reduction in the surface tension of water when dissolved in minute concentrations. Ethanol and isopropanol are examples of such voc's that are of relatively minor hazard.

Higher concentrations of this voc are absorbed into the meniscus zone adjacent to the solid surface than are absorbed in the vicinity of the continuously refreshed zone near the free surface flow. Thus, the surface tension of the liquid meniscus is lower near the solid surface than near the flowing free surface. This surface tension gradient is sufficiently strong to cause a flow in the meniscus region away from the solid surface toward the falling film. This flow prevents the wicking of the aqueous processing fluid onto a hydrophilic surface, and prevents a thin film from being deposited as the wetted zone is moved slowly relatively to the workpiece surface while it is attached to said surface.

The voc can be introduced into the vicinity of the meniscus by evaporation of a pool of the liquid phase or from a porous medium saturated with the liquid phase of the voc. Alternatively, it can be introduced by forced convection of a carrier gas, containing a small amount of the voc, into this vicinity. The voc absorbed into the aqueous processing fluid can be removed by absorption on an activated carbon filter medium, for example, or can be allowed to build up without decreasing effectiveness for long periods when a sufficiently large processing liquid reservoir is used.

Surface tension gradients can also be established by thermal gradients. Heating the workpiece, for example, can lower the surface tension of the liquid at the attached meniscus in the vicinity of the workpiece surface compared with the surface tension of the cooler fluid flowing at the free surface flow. The resultant surface tension gradient is equivalent to that chemically produced according to the above description, and will result in an equivalent flow.

Contact of the processing fluid (such as an etchant solution) in the manner described above does not require mechanical contact with the workpiece and does not generate any mechanical stresses in the workpiece. When applied to etching of polished glass or crystal surfaces for optical application, a backpressure need not be applied to the backside of the workpiece, and it can be left open. This allows for back-side monitoring of the workpiece by such means as interferometry, whereby the local workpiece thickness can be measured and the resultant data used for real-time control of the motion of the wetted zone relative to the workpiece to achieve a desired figure. Also, the lack of mechanical stress generated by this process enables the figuring to optical tolerances of very thin extruded glass sheets that are very difficult or impossible to figure by traditional techniques.

The object of this invention is not limited to figuring of optics by etching, but can be applied to processes in which deposition occurs onto a surface from an aqueous solution, such as epitaxial layer growth from solution onto substrates. It can also be used for local treatment of surfaces with aqueous solutions while keeping adjacent areas on the surface dry. One skilled in the art will find other uses for the general concept.

DETAILED DESCRIPTION OF THE INVENTION

The present invention involves modifying the surface of an object by contacting the surface with a liquid processing solution using the liquid applicator geometry and surface tension gradients (the Marangoni effect) to define and confine the dimensions of the wetted zone on the object surface. More specifically, the invention is directed to a method and apparatus for contouring or figuring the surface of an object using an etchant solution as the wetting fluid and using real-time metrology (e.g. interferometry) to control the placement and dwell time of this wetted zone, thereby removing material from the surface in a controlled manner. The wetted zone remains a constant size and shape as it is moved around the workpiece surface, whereby the etchant solution acts on the surface only in this wetted zone. This allows for the processing of very thin (<1) mm thickness) plates, as well as the production of large (<5-cm major axis) plates, that cannot be processed by other apparatus or methods. This is accomplished by the establishment of a meniscus of an aqueous liquid processing fluid (etchant solution) on the surface of the object being processed, such that one edge of the meniscus is the line attachment of the liquid to the surface, and the other edge becomes the free surface of a falling film of the fluid. A surface tension gradient (the Marangoni effect) is established in the meniscus by introducing a volatile organic compound (voc) into the vicinity of the meniscus, if such voc has the property that it is at least slightly water soluble and produces a large reduction in the surface tension of water when dissolved in minute concentrations. The voc may, for example be, ethanol or isopropanol. The surface tension gradients can also be established by thermal gradients, such as heating the workpiece. The wetted zone may be established by pumping the processing fluid through a slit or annular orifice, wherein wetted zone takes the shape of a thin rectangular zone or of a circular spot.

Figure 1:
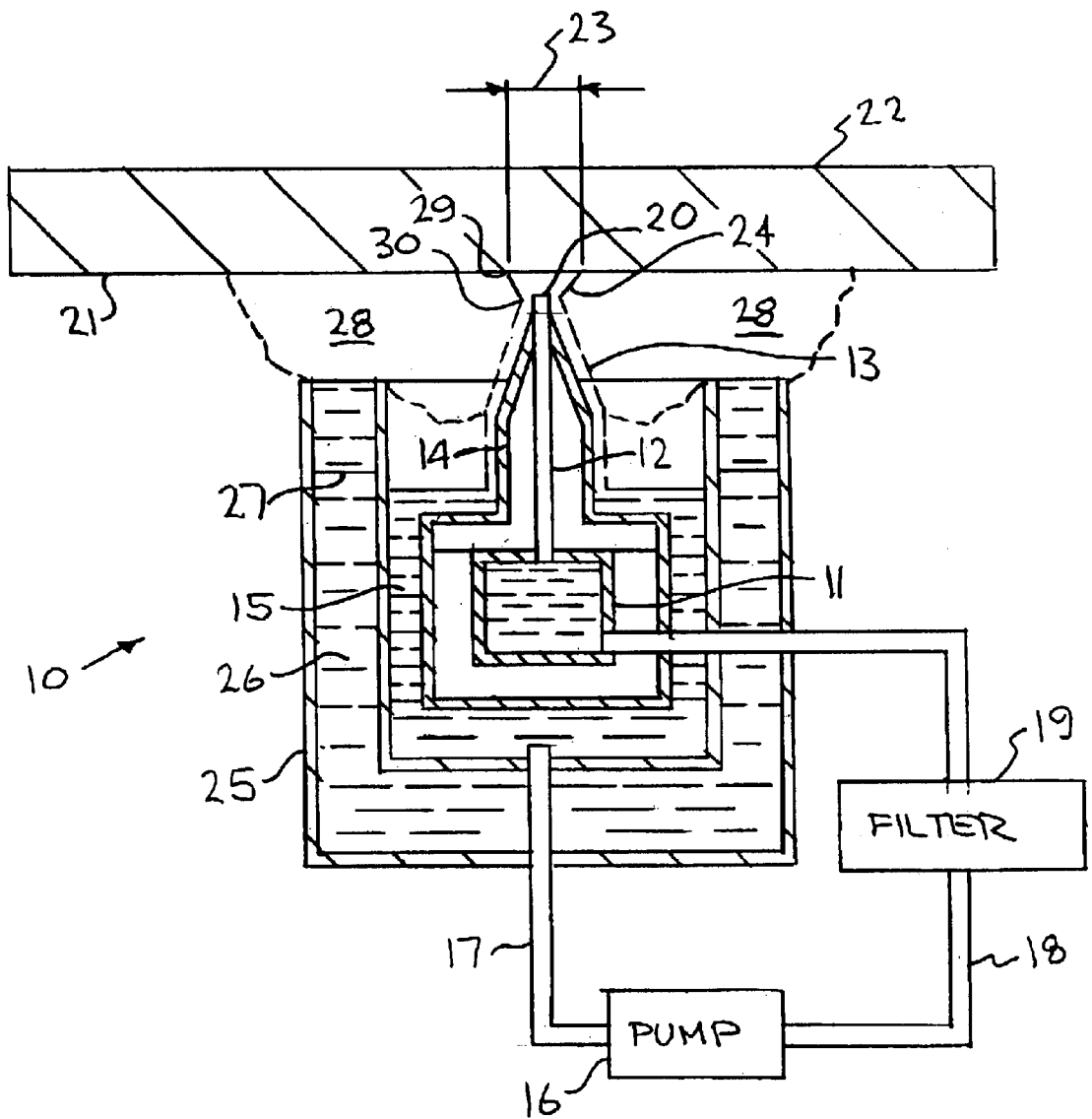
FIG. 1 shows a detailed view of the meniscus region of flow geometry utilized in one embodiment of the invention.

Referring now to the drawings, FIG. 1 illustrates an applicator assembly generally indicated at 10 which includes an inlet fluid reservoir 11 and a slot die or orifice 12. Processing liquid 13 flows from reservoir 11 through orifice 12 and down the outer side of the die 14 forming the orifice, and collects in an outer reservoir 15. A pump 16 pumps processing fluid from reservoir 15 through line 17 back into reservoir 11 through line 18 to continuously recirculate it. An inline filter 19 can be installed in line 18. The orifice 12 may be circular, slotted or of a variety of configurations. The processing fluid 13 issuing out of the orifice at 20 is attached by capillary forces to the lower surface 21 of a workpiece or member 22, creating a wetted zone 23 on said workpiece, bordered on all sides by a meniscus 24. The liquid 13 being pumped through orifice 12 flows down the outside of the die 14 in a falling film flow. The member 25 surrounding the outer reservoir 15 contains an another channel or reservoir 26 surrounding the outer surface of the die 14. This reservoir contains a suitable voc material 27, such as a few milliliters of isopropanol. This voc 27 evaporates into the air space indicated at 28, surrounding the meniscus 24 of the wetted zone 23. The voc 27 absorbs in the liquid film, lowering its surface tension at point 29 relative to point 30. The resultant surface tension gradient pulls liquid away from point 29 and prevents the spread or entrainment of a thin liquid film on the workpiece surface 21. The wetted zone 23 is thusly stably confined and can be translated relative to the lower surface 21 of the workpiece 22.

The processing liquid or etchant solution 13 very slowly accumulates dissolved solvent, but can remain viable for very many processing steps since the concentration of solvent in the bulk liquid builds very slowly, while the concentration in the very thin water film directly above the solvent vapor source is always relatively high. This solvent can alternatively be removed from the stream by absorption on, for example, activated carbon filter media.

The surface tension gradient can also be realized by convection of voc-laden carrier gas into the meniscus region, or by convection of heated gas in this vicinity, or by heating the backside of the workpiece.

Figure 2:
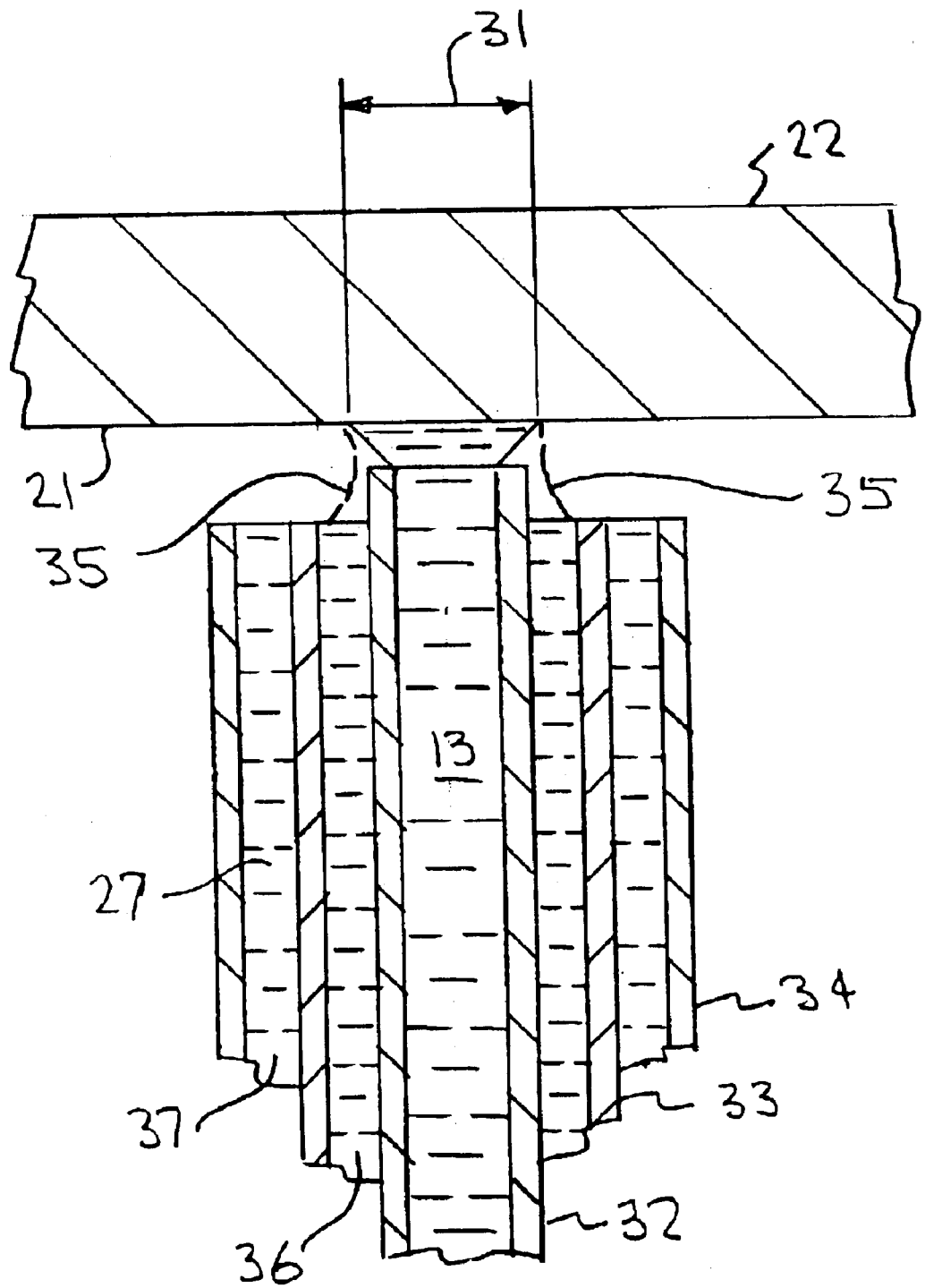
FIG. 2 shows a circular small-tool processing geometry wherein the processing fluid issues from the inside of a tube and flows down the outside of said tube.

FIG. 2 illustrates an embodiment of the invention utilizing concentric tubes, wherein the wetted zone forms a circular region 31 defined by issuance of the processing liquid 13 from the inside of the circular tube 32 which comprises the central tube of the three concentric tubes 32, 33 and 34. The drainage of the processing liquid from the surface 21 of workpiece 22 is down the outside of tube 32 as shown at 35. The annular space 36 between tubes 32 and 33 forms a reservoir for the processing liquid 13 and the annular space 37 between tubes 33 and 34 forms a reservoir for voc material 27. While not shown, processing liquid is pumped into tube 32 and returned via reservoir 37 via a pump and filter arrangement as in FIG. 1. The wetted zone 31 on the workpiece surface 21 is circular due to the geometry of the tube 32. This wetted zone is confined by absorption into the processing liquid 13 of voc vapors 27 emanating from the annular space 37.

Figure 3:
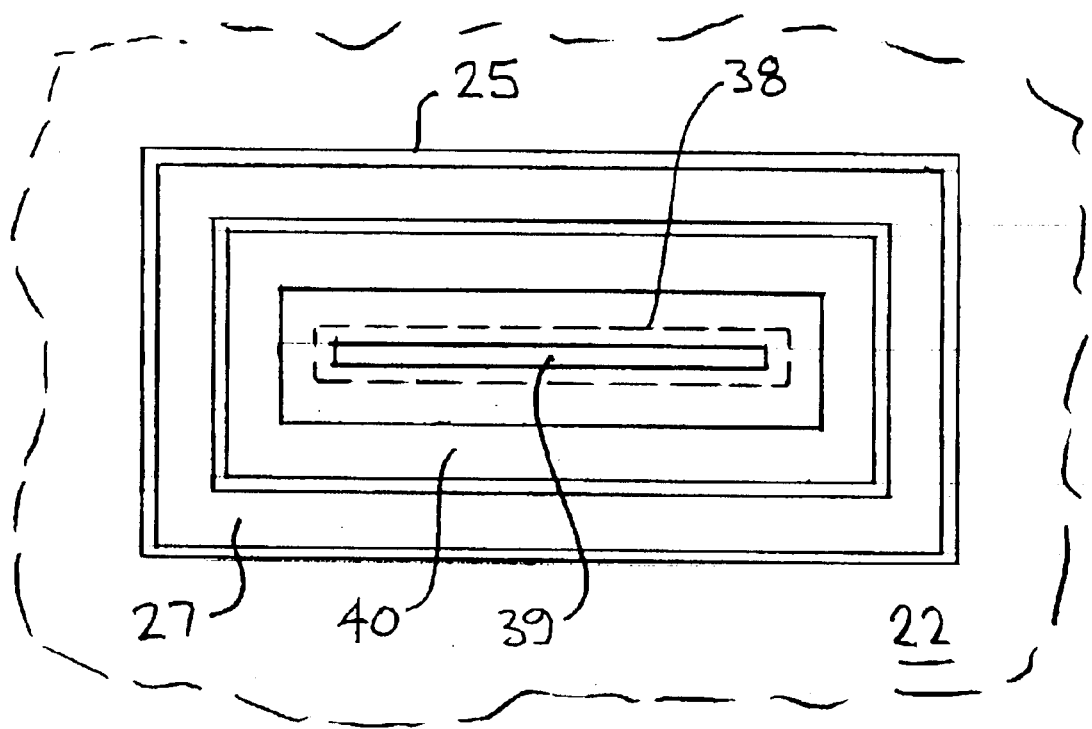
FIG. 3 shows a cross-section of a linear small-tool processing geometry of FIG. 1 wherein the processing fluid issues from a slot and flows down both sides of a die forming the slot.

FIG. 3 shows an embodiment of the invention in plan view, similar to that of FIG. 1, wherein the wetted zone 38 is a long, thin linear zone defined by issuance of processing liquid from a slit 39. This liquid flows down the outside of the member or die 40 forming the slot 39.

Figure 4:
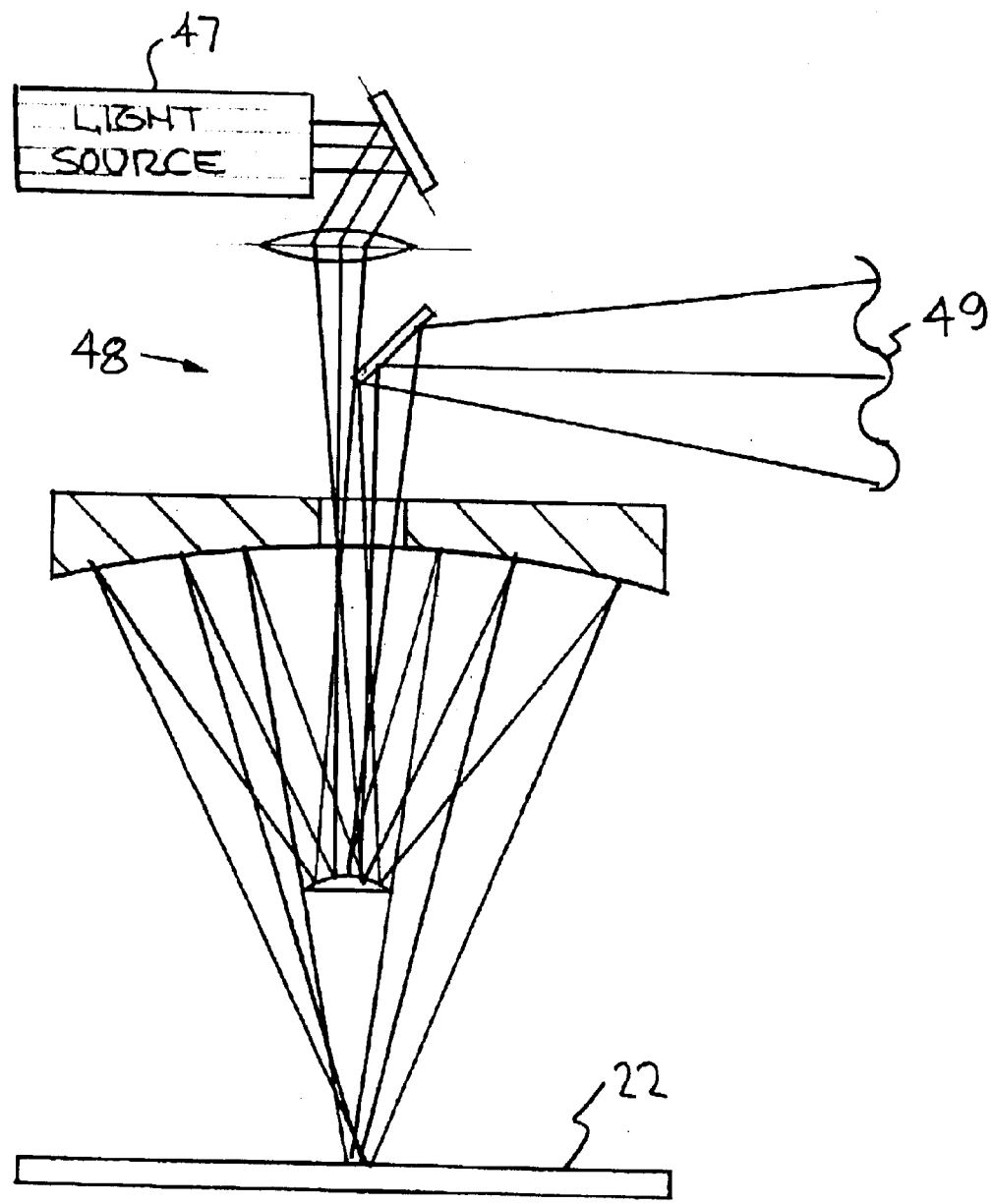
FIG. 4 shows an optical setup using a laser and associated optics to generate an interference pattern between the two surfaces of a workpiece transparent to the laser wavelength. This interference pattern is used to calculate the thickness of the workpiece in the region illuminated by the laser.

FIG. 4 shows an interferometer consisting of a laser or collimated light source 47, an imaging system 48 consisting of mirrors, lenses, and other optics, capable of producing a fringe pattern 49 useful for image processing.

Figure 5:
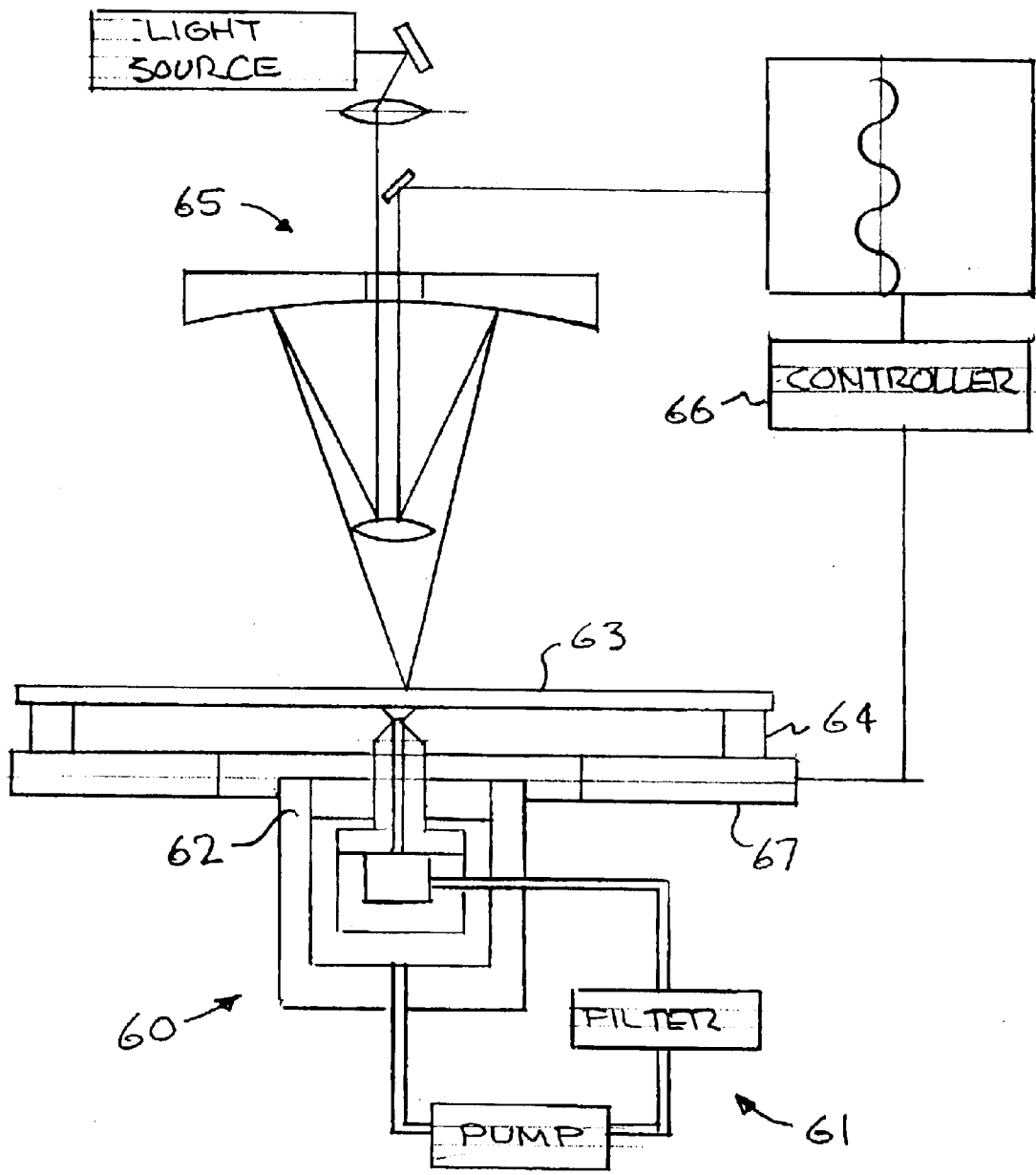
FIG. 5 shows an apparatus for etching a glass plate or similar material, consisting of a processing fluid applicator, processing fluid recirculation system, voc delivery system, x-y translation stage, substrate holder, interferometer, and computer control system.

FIG. 5 shows an apparatus consisting of a processing fluid applicator 60; a fluid delivery system 61 consisting of a reservoir, pump and filter; a voc source 62; a workpiece 63; a mounting structure for the workpiece 64; a metrology device such as an interferometer 65; a computer controller 66; and an XY translation stage 67 controlled by said controller.

Workpieces can include but are not limited to large silicon wafers, flat panel display substrates, large glass sheets or optical substrates, crystal surfaces, metal sheets, etc. Uniform and constant irrigation by the processing fluid in the immediate vicinity of the meniscus is essential for the successful operation of the Marangoni effect.

A volatile organic compound (voc) vapor source for establishment of necessary surface tension gradients can be a pool of liquid or a saturated porous material such as a sponge placed in the vicinity of the meniscus of processing fluid. It can also be entrained in a carrier gas flow delivered to the vicinity of the meniscus. The voc can be any compound that has an appreciable vapor pressure at room temperature, is water soluble, and has the effect that small amounts dissolved in water significantly reduce the water surface tension. Examples of suitable voc's of relatively minor hazard include isopropanol and ethanol. A thermal means of establishment of necessary surface tension gradients can be realized by heating the workpiece from the opposite side, or by introducing a heat source such as an electrically heated wire or a heated gas flow surrounding the meniscus defining the perimeter of the wetted zone. To implement the motion of the wetted processing zone on the workpiece surface, the workpiece can be moved relative to a stationary processing fluid applicator, or the applicator can be moved relative to the stationary workpiece, or both can be in relative motion.

Changes and modifications in the specifically described embodiments can be carried out without departing from the scope of the invention, which is intended to be limited by the scope of the appended claims.

What is claimed is:

1. An apparatus for etching or depositing a desired profile onto the surface of an object comprising:

A. a means for delivery of liquid etchant/deposition solution to an applicator,

B. an applicator configured for contacting a surface of an object with said solution, with a desired geometry, such that a free-surface flow of liquid solution exists around a periphery of a wetted zone on the object, C. means for inducing a surface tension gradient (Marangoni effect) in a meniscus region of a three-phase contact line where the liquid solution attaches to the object being processed, D. a linear or bi-directional motion stage for controlled motion of the wetted zone relative to the surface of the object being processed, E. an encoder or interferometer, imaging device and imageprocessing algorithm to calculate topography of the object being processed in real time as the object is in motion relative to said applicator, and F. a computer-control system that uses the calculations obtained from this metrology to control the motion of the stage.

2. The apparatus of claim 1, wherein said means for delivery of the liquid solution includes a member having an opening selected from the group consisting of an orifice and a slit.

3. The apparatus of claim 1, wherein said applicator includes a plurality of concentric tubes.

4. The apparatus of claim 1, wherein said applicator comprises a member having a central opening and tapered outer surfaces adjacent an end of said central opening.

5. The apparatus of claim 1, wherein said means for introducing a surface tension gradient includes a reservoir containing a material capable of producing an organic vapor.

6. The apparatus of claim 1, additionally including means for recirculating said liquid solution.

7. The apparatus of claim 1, wherein said applicator includes a housing having a central opening an surrounded by a reservoir containing a material for producing an organic vapor.

8. The apparatus of claim 7, wherein said housing and said reservoir comprise a plurality of concentric tubes, an intermost of said concentric tubes defining said central opening.

9. A flat glass comprising the object and having a thickness of <1 mm processed by the method of claim 2.

10. The apparatus of claim 1, wherein the object comprises a flat glass sheet having a final thickness of <1 mm.

11. An apparatus for etching or depositing a desired profile onto a surface of an associated object, comprising:

a mechanism for delivering of liquid etchant/deposition solution to an applicator, said mechanism including a member having an opening selected from the group consisting of an orifice and a slit, said applicator being configured for contacting a surface of such an associated object with said solution, with a desired geometry, such that a free-surface flow of liquid solution exits around a periphery of a wetted zone on such an associated object, means for inducing a surface tension gradient (Marangoni Effect) in a menicus region of a three-phase contact line where the liquid solution attaches to such an associated object being processed, a motion stage for controlled motion of the wetted zone relative to the surface of such an associated object being processed, an imaging device and image processing algorithm to calculate topography of such an associated object being processed in real time as such an associated object is in motion relative to said applicator, and a computer-control system that uses the calculations from this metrology to control the motion of the stage.

12. The apparatus of claim 11, wherein said motion stage is selected from the group consisting of linear and bi-directional motion stages.

13. The apparatus of claim 11, wherein said imaging device is selected from the group consisting of an encoder in an an interferometer.

14. The apparatus of claim 11, wherein said applicator includes a plurality of concentric tubes.

15. The apparatus of claim 11, wherein said applicator comprises a member having a central opening and tapered outer surfaces adjacent an end of said central opening.

16. The apparatus of claim 11, wherein said means for introducing a surface tension gradient includes a reservoir containing a material capable of producing an organic vapor.

17. The apparatus of claim 11, additionally including means for recirculating said liquid solution.

18. The apparatus of claim 11, wherein said applicator includes a housing having a central opening and surrounded by a reservoir containing a material for producing an organic vapor.

19. The apparatus of claim 18, wherein said housing and said reservoir comprise a plurality of concentric tubes, an intermost of said concentric tubes defining said central opening.

20. The apparatus of claim 11, wherein the associated object comprises a flat glass sheet having a final thickness of <1 mm.

* * * * *